United States Patent
Lin et al.

(10) Patent No.: US 6,978,191 B2
(45) Date of Patent: Dec. 20, 2005

(54) OVERLAY REGISTRATION CONTROL SYSTEM AND METHOD EMPLOYING MULTIPLE PILOT LOT IN-LINE OVERLAY REGISTRATION MEASUREMENT

(75) Inventors: Yo-Nien Lin, Tainan (TW); Kuan-Luan Cheng, Tainan (TW); Kun-Pi Cheng, Tainan (TW); Hsin-Yuan Chen, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 102 days.

(21) Appl. No.: 10/656,757

(22) Filed: Sep. 6, 2003

(65) Prior Publication Data

US 2005/0055122 A1    Mar. 10, 2005

(51) Int. Cl.[7] ................................................. G06F 7/00
(52) U.S. Cl. ............................... 700/213; 430/30
(58) Field of Search ............................. 700/23; 430/30

(56) References Cited

U.S. PATENT DOCUMENTS

| | | | |
|---|---|---|---|
| 5,923,041 A | 7/1999 | Cresswell et al. | |
| 6,233,494 B1 | 5/2001 | Aoyagi | |
| 6,405,096 B1 | 6/2002 | Toprac et al. | |
| 6,737,208 B1 * | 5/2004 | Bode et al. | 430/30 |
| 6,788,996 B2 * | 9/2004 | Shimizu | 700/213 |

* cited by examiner

Primary Examiner—Albert W. Paladini
Assistant Examiner—Sheela S. Rao
(74) Attorney, Agent, or Firm—Tung & Associates

(57) ABSTRACT

A method for fabricating a microelectronic product and a system for fabricating the microelectronic product each employ an in-line automatic photolithographic processing and overlay registration measurement for a pair of pilot lots of a new product order, prior to in-line automatic processing of an additional new product order lot within a photolithographic process tool. The method and the system provide for efficient production of new product order lots, absent need for an independent pilot lot qualification method or system.

28 Claims, 3 Drawing Sheets

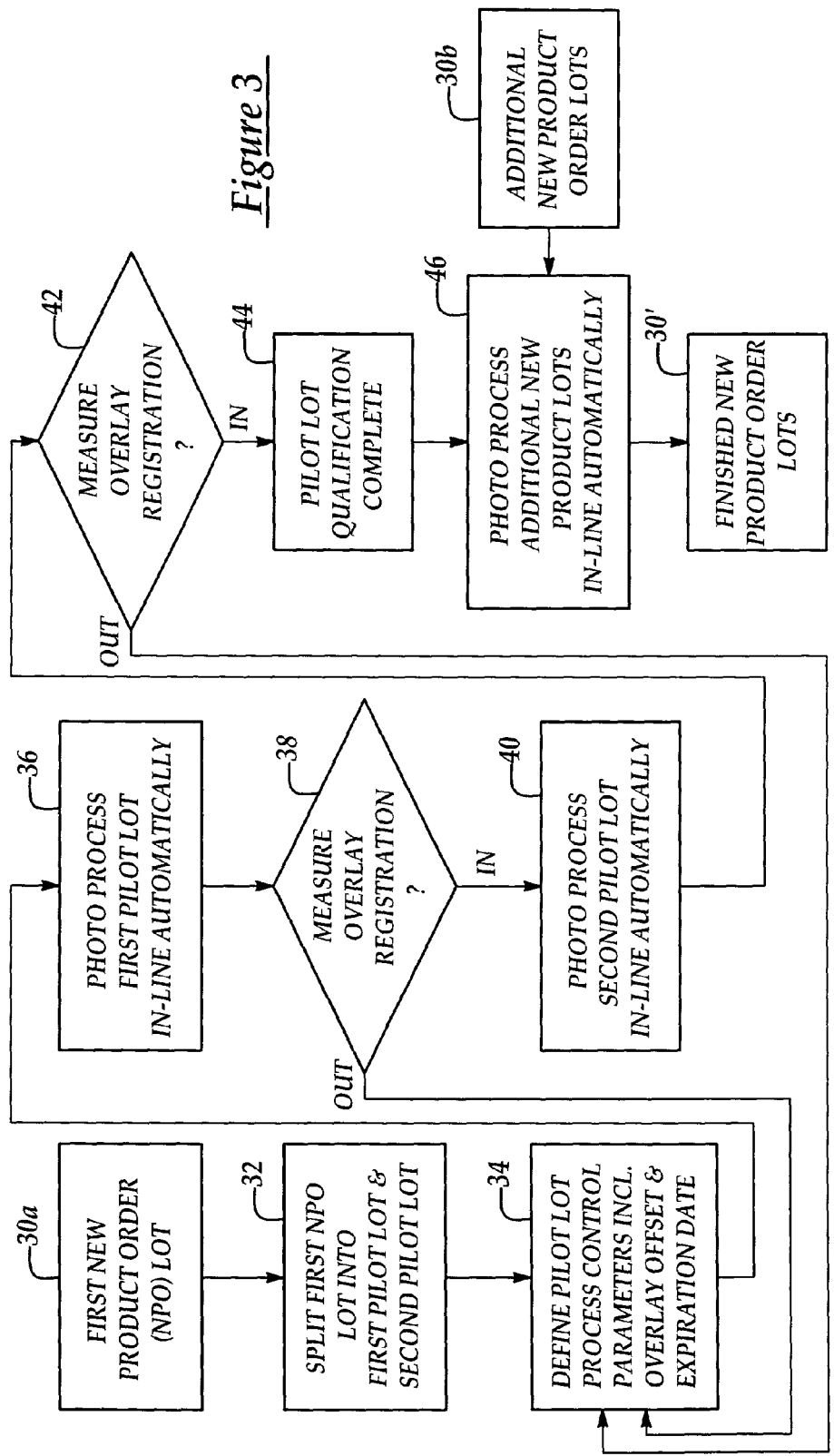

OVERLAY REGISTRATION CONTROL SYSTEM AND METHOD EMPLOYING MULTIPLE PILOT LOT IN-LINE OVERLAY REGISTRATION MEASUREMENT

BACKGROUND OF THE INVENTION

1. Field of the Invention

The present invention relates generally to overlay registration control when fabricating microelectronic products. More particularly, the present invention relates to systems and methods for efficient overlay registration control when fabricating microelectronic products.

2. Description of the Related Art

Microelectronic products are typically fabricated employing multiple overlying levels of interconnected patterned conductor layers which are separated by dielectric layers. When fabricating microelectronic products, it is important that the multiple overlying interconnected patterned conductor layers are properly registered with respect to each other such as to assure proper functionality of a microelectronic product.

While overlay registration of patterned conductor layers is thus essential in the microelectronic product fabrication art, overlay registration of patterned conductor layers in nonetheless not entirely without problems in the microelectronic product fabrication art. In that regard, it is often difficult to provide efficient overlay registration control when fabricating microelectronic products, and in particular when initially fabricating new product order lots within a microelectronic fabrication facility. New product order lots are generally intended as products lots which might employ a novel technology limitation, such as linewidth or areal density of patterned conductor layers.

It is thus desirable in the microelectronic product fabrication art to provide apparatus, systems and methods for efficient overlay registration control when fabricating microelectronic products. It is towards the foregoing object that the present invention is directed.

Various apparatus, systems and methods have been disclosed in the microelectronic product fabrication art for controlling overlay registration when fabricating microelectronic products.

Included but not limiting among the apparatus, systems and methods are those disclosed within: (1) Cresswell et al., in U.S. Pat. No. 5,923,041 (a self-correcting image sensor method which provides for overlay control when fabricating a microelectronic product); and (2) Toprac et al., in U.S. Pat. No. 6,405,096 (an apparatus and method for run-to-run control of overlay registration when fabricating a microelectronic product).

Desirable in the microelectronic product fabrication art are additional apparatus, systems and methods for controlling overlay registration when fabricating microelectronic products.

It is towards the foregoing object that the present invention is directed.

SUMMARY OF THE INVENTION

A first object of the invention is to provide a system and a method for controlling overlay registration when fabricating a microelectronic product.

A second object of the invention is to provide a system and a method in accord with the first object of the invention, wherein the overlay registration is efficiently controlled.

In accord with the objects of the invention, the invention provides a method for controlling overlay registration when fabricating a microelectronic product and a system for controlling overlay registration when fabricating the microelectronic product.

In accord with the invention, the method first provides a photolithographic process cell comprising a photolithographic process tool, a photolithographic measurement tool and a computer controller. The method also provides for introducing into the photolithographic process cell a new product order comprising a first lot and at least one additional lot, each having an overlay registration offset which is recorded in the computer controller. The method also provides for dividing the first lot into a first pilot lot and a second pilot lot to be sequentially processed in the photolithographic process tool and measured in the photolithographic measurement tool while being controlled by the computer controller. The method next provides for processing the first pilot lot in-line automatically within photolithographic process tool, measuring the overlay registration thereof within the photolithographic measurement tool and assuring conformance thereof with the computer controller. The method further provides for processing the second pilot lot in-line automatically within the photolithographic process tool, measuring the overlay registration thereof within the photolithographic measurement tool and assuring conformance thereof with the computer controller. Finally, the method provides for processing the at least one additional lot in-line automatically within the photolithographic process tool.

The method in accord with the invention contemplates a system in accord with the invention.

The invention provides a system and a method for controlling overlay registration when fabricating a microelectronic product, wherein the overlay registration is efficiently controlled.

The invention realizes the foregoing object within the context of fabricating a new product order of a microelectronic product comprising a first lot and at least one additional lot by dividing the first lot into a first pilot lot and a second pilot lot. Each of the first pilot lot and the second pilot lot is processed in-line automatically within a photolithographic process tool, has its overlay registration measured within a photolithographic measurement tool and conformance thereof assured with a computer controller, prior to processing the at least one additional lot in-line automatically within the photolithographic process tool.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 3 shows a schematic process flow diagram of a method in accord with the present invention.

DESCRIPTION OF THE PREFERRED EMBODIMENT

The invention provides a system and a method for controlling overlay registration when fabricating a microelectronic product, wherein the overlay registration is efficiently controlled.

The invention realizes the foregoing object within the context of fabricating a new product order of a microelectronic product comprising a first lot and at least one additional lot by dividing the first lot into a first pilot lot and a second pilot lot. Within the invention, each of the first pilot lot and the second pilot lot is processed in-line automatically within a photolithographic process tool, has its overlay registration measured in-line automatically within a photolithographic measurement tool and conformance thereof assured with a computer controller, prior to processing at least one additional lot of the new product order in-line automatically within the photolithographic process tool.

Figure 1:
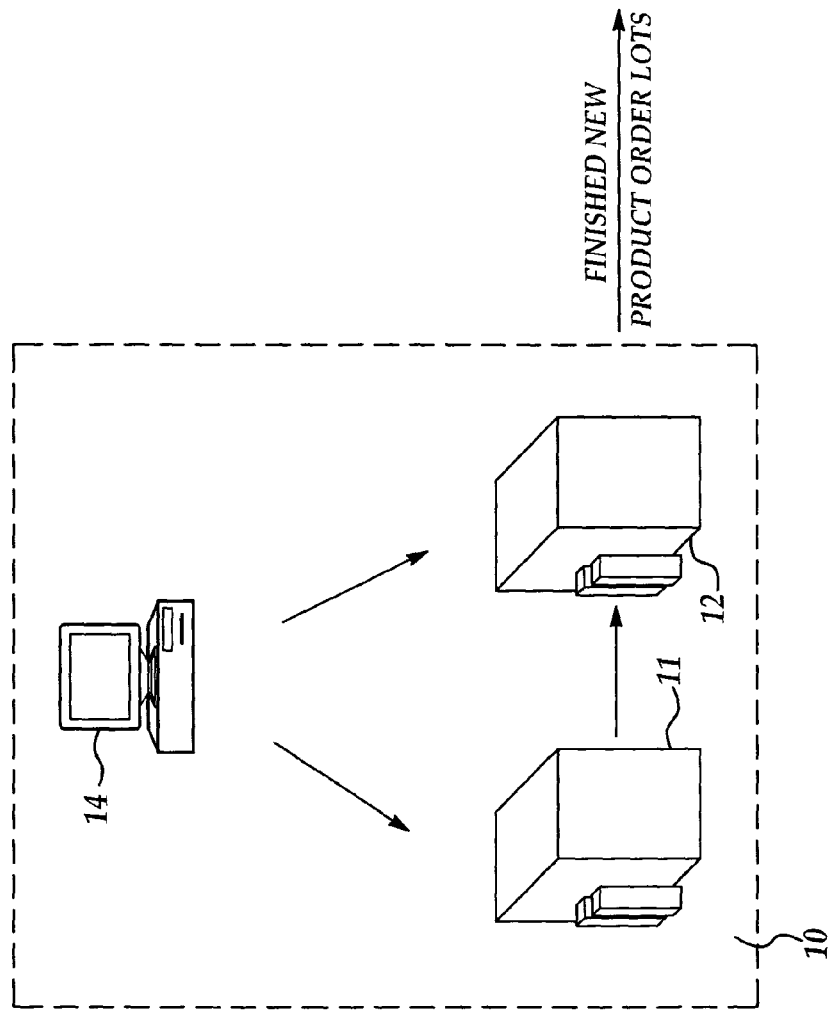
FIG. 1 shows a schematic block diagram illustrating a system in accord with the present invention.

FIG. 1 shows a schematic block diagram of a system in accord with the invention.

FIG. 1 illustrates a new product order 16 which is desired to be fabricated within a microelectronic fabrication facility. The new product order 16 comprises: (1) a first new product order lot 16a, as well as; (2) at least one additional new product order lot 16b. The system as illustrated in FIG. 1 also comprises a photolithographic process cell 10 which comprises a photolithographic process tool 11, a photolithographic measurement tool 12 and a computer controller 14 which controls in-line and automatically the photolithographic process tool 11 and the photolithographic measurement tool 12.

Within the invention, the new product order 16 which comprises the first new product order lot 16a and the at least one additional new product order lot 16b may comprise a microelectronic product selected from the group including but not limited to semiconductor products and ceramic substrate products. Typically, each of the first new product order lot 16a and the at least one additional new product order lot 16b comprises up to about 50 substrates carried in an individual substrate carrier.

Within the invention, the photolithographic process tool 11 is typically selected from the group including but not limited to a photolithographic scanner process tool and a photolithographic stepper process tool. Either of foregoing photolithographic process tools is intended to be employed in photoexposing a blanket photoresist layer formed over each substrate within the new product order 16 such as to form a patterned photoresist layer which is employed as an etch mask layer for forming a patterned layer from a blanket layer formed beneath the patterned photoresist layer.

Within the invention, the photolithographic measurement tool 12 is an overlay registration measurement tool which is intended to measure an overlayer registration offset of a patterned photoresist layer with respect to an underlying patterned layer or overlay registration fiducial within a substrate within the first new product order lot 16a or the series of additional new product order lots 16b.

Within the invention, the computer controller 14 is otherwise generally conventional in the microelectronic product fabrication art and may comprise a personal computer or a network server which is intended to control each of the photolihographic process tool 11 and the photolithographic measurement tool 12. The computer controller 14 may also control the flow of the first new product order lot 16a and the at least one additional new product order lot 16b through the photolithographic process tool 11 and the photolithographic measurement tool 12. The computer controller 14 is otherwise specifically programmed to effect the objects of the invention. In that regard, the invention is intended to provide for an efficient introduction of the new product order 16 into a microelectronic fabrication facility having contained therein the photolithographic process cell 10.

Figure 2:
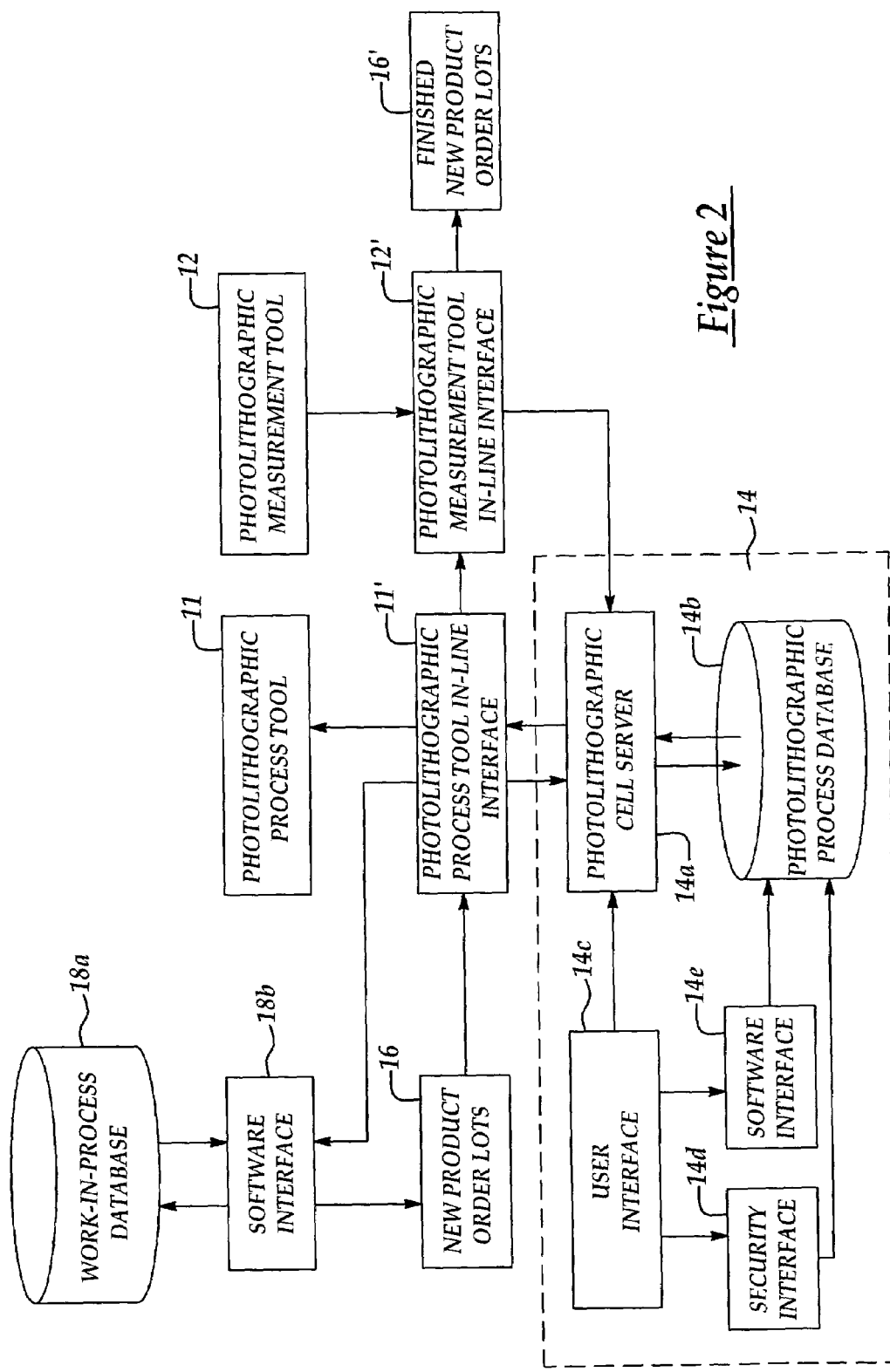
FIG. 2 shows a schematic block diagram illustrating in greater detail a system in accord with the present invention.

FIG. 2 shows a schematic block diagram illustrating in greater detail a system in accord with the present invention.

FIG. 2 illustrates the photolithographic process tool 11 and the photolithographic measurement tool 12 and the new product order lots 16 as illustrated in FIG. 1. FIG. 2 also illustrates a photolithographic process tool in-line interface 11' associated with the photolithographic process tool 11 and a photolithographic measurement tool in-line interface 12' associated with the photolithographic measurement tool. FIG. 2 also illustrates the computer controller 14 in greater detail, such as to includes a photolithographic cell server 14a having associated therewith a photolithographic process database 14b. The photolithographic cell server 14a and the photolithographic process database 14b also have associated therewith a user interface 14c, such as a graphical user interface and a keyboard user interface, as well as a security interface 14d and a software interface 14e which provide for complete operation of the computer controller 14. Finally, the system as illustrated in FIG. 2 also comprises a work in process database 18a having associated therewith a software interface 18b for purposes of controlling the series of new product order lots 16 as they travel through the photolithographic process tool in-line interface 11' and the photolithographic measurement tool in-line interface 12' and are photolithographically processed and measured to become finished new product order lots 16'.

FIG. 3 shows a schematic process flow diagram illustrating a series of process steps in accord with a method of the present invention.

Within FIG. 3, both a first new product order lot 30a and a series of additional new product order lots 30b are introduced into a photolithographic process cell in accord with the systems as illustrated in FIG. 1 and FIG. 2.

In accord with the block which corresponds with reference numeral 32, the first new product order lot is split into a first pilot lot (i.e., a parent lot) and a second pilot lot (i.e., a child lot).

In accord with the block which corresponds with reference numeral 34, an in-line automatic photolithographic computer controller for the photolithographic process cell is programmed to define the first pilot lot, the second pilot lot, photolithographic process control parameters (including overlay registration offset) and an expiration date beyond which recalibration and requalification is needed for a photolithographic process tool and a photolithographic measurement tool within the photolithographic process cell. The in-line automatic photolithographic computer controller is also programmed with the additional new product order lots 30b information.

In accord with the block which corresponds with reference numeral 36, the first pilot lot is processed in-line automatically within a photolithographic process tool, such as but not limited to a scanner or a stepper. In addition, and in accord with the block which corresponds with reference numeral 38, an overlay registration is measured in-line automatically for the first pilot lot.

If the overlay registration measurement is not in accord with specification expectations, an overlay registration offset in accord with the block which corresponds with reference numeral 34 is revised. Such revision is typically effected incident to manual control. If the overlay registration measurement is in accord with specification expectations, and in accord with the block which corresponds with reference numeral 40, only then is the second pilot lot is processed in-line automatically within the photolithographic process tool.

In accord with the block which corresponds with reference numeral 42 an overlay registration offset of the second pilot lot is measured in-line automatically within the photolithographic measurement tool.

If the overlay registration measurement is not in accord with specification expectations, an overlay registration offset is again revised (typically manually) within the in-line automatic computer controller for photoexposing a blanket photoresist layer formed upon a substrate within the second pilot lot. If the overlay registration is in accord with specification expectations, and in accord with the blocks which corresponds with reference numerals 44 and 46, the first pilot lot and the second pilot lot qualification are completed and the additional new product order lots 30*b* are then (and only then) allowed to process in-line automatically within the photolithographic processing tool to provide a series of finished new product order lots 30'. The series of additional new product order lots 30*b* need not necessarily be processed in-line automatically within the photolithographic measurement tool, presuming that an expiration date has not been exceeded beyond which recalibration and requalification of the photolithographic process tool and the photolithographic measurement tool is required. Such recalibration and requalification will typically reset the in-line automatic computer controller to a pilot mode, and the process steps as illustrated within the schematic block diagram of FIG. 3 will be repeated, although not necessarily within the context of a new product order.

The present invention thus provides for an in-line and automatic qualification of a first new product order lot (which is divided into a first pilot lot and a second pilot lot) with respect to a photolithographic process tool and a photolithographic measurement tool, prior to allowing for additional in-line and automatic processing of additional new product order lots within a microelectronic fabrication facility. The invention provides value insofar as the invention avoids the need for a separate and independent pilot lot procedure and associated separate and independent data and information management resources directed towards an independent qualification of a new product order within a photolithographic process tool and a photolithographic measurement tool.

The preferred embodiment of the invention is illustrative of the invention rather than limiting of the invention. Revisions and modification may be made to apparatus and procedures in accord with the preferred embodiment of the invention while still providing a system in accord with the invention and a method in accord with the invention, further in accord with the accompanying claims.

What is claimed is:

1. A method for calibrating a semiconductor photolithographic process comprising an overlay registration specification using at least one pilot lot of process substrates, said calibration for use in sequentially processing a subsequent lot of process substrates according to said semiconductor photolithographic process comprising the steps of:

defining an overlay registration specification of first pilot lot and at least one additional lot on a user interface, said pilot first lot comprising a plurality of process substrates for calibrating said photolithographic process;

performing said photolithographic process on said first pilot lot;

measuring an overlay offset value of said first pilot lot; and automatically performing said photolithographic process on said at least one additional lot when said overlay offset value conforms to said overlay registration specification.

2. The method of claim 1 wherein said photolithographic process is automatically performed on said first pilot lot.

3. The method of claim 1 wherein said at least one additional lot is a second pilot lot.

4. The method of claim 1 wherein said at least one additional lot is not a pilot lot.

5. A method for calibrating a microelectronic product photolithographic process comprising an overlay registration specification using a plurality of pilot lot of process substrates, said calibration for use in sequentially processing a subsequent lot of process substrates in said microelectronic photolithographic process comprising the steps of:

providing a photolithographic process cell comprising a photolithographic process tool, a photolithographic measurement tool and a computer controller;

introducing into the photolithographic process cell a new product order comprising a first lot and at least one additional lot, each having an overlay registration specification which is recorded in the computer controller;

dividing the first lot into a first pilot lot of process substrates and a second pilot lot of process substrates, each pilot lot to be sequentially processed for calibrating said photolithographic process, said sequential processing comprising processing in the photolithographic process tool and measuring in the photolithographic measurement tool while being controlled by the computer controller;

processing the first pilot lot in-line automatically within photolithographic process tool, measuring the overlay registration thereof in-line automatically within the photolithographic measurement tool and assuring conformance thereof with the overlay registration specification according to the computer controller;

processing the second pilot lot in-line automatically within the photolithographic process tool, measuring the overlay registration thereof in-line automatically within the photolithographic measurement tool and assuring conformance thereof with the overlay registration specification according to the computer controller; and processing the at least one additional lot in-line automatically within the photolithographic process tool.

6. The method of claim 5 wherein conformance of the first pilot lot is assured prior to processing the second pilot lot.

7. The method of claim 5 wherein conformance of the second pilot lot is assured prior to processing the at least one additional lot.

8. The method of claim 5 wherein an overlay registration of the at least one additional lot is neither measured nor conformance thereof assured.

9. The method of claim 5 wherein the new product order is for a microelectronic product selected from the group consisting of semiconductor products and ceramic substrate products.

10. The method of claim 5 wherein the photolithographic process tool is a stepper.

11. The method of claim 5 wherein the photolithographic process tool is a scanner.

12. A method for calibrating a photolithographic process according to an overlay registration specification using a plurality of pilot lots of process substrates, said calibration for use in sequentially processing a subsequent lot of process substrates according to said photolithographic process when fabricating a semiconductor product comprising:
provilding a photolithographic process cell comprising a photolithographic process tool, a photolithographic measurement tool and a computer controller;
introducing into the photolithographic process cell a new semiconductor product order comprising a first lot and at least one additional lot, each lot comprising a plurality of process substrates having an overlay registration specification which is recorded in the computer controller;
dividing the first lot into a first pilot lot and a second pilot lot to be sequentially processed in the photolithographic process tool and measured in the photolithographic measurement tool to calibrate said photolithographic process, said sequential processing being controlled by the computer controller;
processing the first pilot lot in-line automatically within photolithographic process tool, measuring the overlay registration thereof in-line automatically within the photolithographic measurement tool and assuring conformance thereof with the computer controller;
processing the second pilot lot in-line automatically within the photolithographic process tool, measuring the overlay registration thereof in-line automatically within the photolithographic measurement tool and assuring conformance thereof with the overlay registration specification according to the computer controller; and
processing the at least one additional lot in-line automatically within the photolithographic process tool.

13. The method of claim 12 wherein conformance of the first pilot lot is assured prior to processing the second pilot lot.

14. The method of claim 12 wherein conformance of the second pilot lot is assured prior to processing the at least one additional lot.

15. The method of claim 12 wherein an overlay registration of the at least one additional lot is neither measured nor conformance thereof assured.

16. The method of claim 12 wherein the photolithographic process tool is a stepper.

17. The method of claim 12 wherein the photolithographic process tool is a scanner.

18. A pilot production overlay offset control system for calibrating a semiconductor photolithographic process comprising an overlay registration specification using at least one pilot lot of process substrates, said calibration for use in sequentially processing a subsequent lot of process substrates according to said photolithographic process comprising:
a user interface for defining a fabrication specification for a first pilot lot and at least one additional lot, said pilot lot comprising a plurality of process substrates for calibrating said photolithographic process, said user interface further for inquiring and/or managing an overlay offset datum of at least said first pilot lot; and
a computer controller providing said user interface, said computer controller for controlling said photolithographic process on said first pilot lot based on said fabrication specification defined by said user interface, and for performing said photolithographic process on said at least one additional lot based on said overlay offset datum of said first pilot lot.

19. The system of claim 18 wherein said computer controller provides for automatically controlling said photolithographic process on said first pilot lot and said at least one additional lot.

20. The system of claim 18 wherein said at least one additional lot is a second pilot lot comprising a plurality of process substrates for calibrating said photolithographic process.

21. The system of claim 18 wherein said at least one additional lot is a separate lot of process substrates.

22. A system for calibrating a photolithographic process comprising an overlay registration specification using a plurality of pilot lots of process substrates, said calibration for use in sequentially processing a subsequent lot of process substrates in a photolithographic process when fabricating a microelectronic product comprising:
a photolithographic process cell comprising:
a photolithographic process tool;
a photolithographic measurement tool; and
a computer controller, wherein the computer controller is:
programmed with said overlay registration specification comprising a new product order of the microelectronic product comprising a plurality of process substrates; and
programmed to sequentially and automatically in-line process and qualify said photolithographic process according to a first pilot lot of said new product order and a second pilot lot of said new product order, said first and second pilot lots comprising subsets of said new product order, said first and second pilot lots processed through the photolithographic process tool and the photolithographic measurement tool prior to processing an additional new product order lot of the new product in-line automatically through the photolithographic process tool.

23. The system of claim 22 wherein the first pilot lot is qualified prior to processing the second pilot lot.

24. The system of claim 22 wherein the second pilot lot is qualified prior to processing the at least one additional lot.

25. The system of claim 22 wherein the new product order is for a semiconductor product.

26. The system of claim 22 wherein the new product order is for a ceramic substrate product.

27. The system of claim 22 wherein the photolithographic process tool is a stepper.

28. The system of claim 22 wherein the photolithographic process tool is a scanner.

* * * * *